US008119256B2

(12) United States Patent
Choi et al.

(10) Patent No.: US 8,119,256 B2
(45) Date of Patent: Feb. 21, 2012

(54) ORGANIC LIGHT EMITTING DEVICE

(75) Inventors: Jin-Baek Choi, Suwon-si (KR);
Chang-Ho Lee, Suwon-si (KR);
Won-Jong Kim, Suwon-si (KR);
Yong-Tak Kim, Suwon-si (KR);
Jong-Hyuk Lee, Suwon-si (KR);
Yoon-Hyeung Cho, Suwon-si (KR);
Byoung-Duk Lee, Suwon-si (KR);
Min-Ho Oh, Suwon-si (KR);
Sun-Young Lee, Suwon-si (KR);
So-Young Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 939 days.

(21) Appl. No.: 12/056,141

(22) Filed: Mar. 26, 2008

(65) Prior Publication Data
US 2009/0011278 A1 Jan. 8, 2009

(30) Foreign Application Priority Data

Jul. 3, 2007 (KR) ........................ 10-2007-0066773

(51) Int. Cl.
*H01L 51/54* (2006.01)
(52) U.S. Cl. ........ 428/690; 428/917; 313/504; 313/506; 257/40
(58) Field of Classification Search ........................ None
See application file for complete search history.

(56) References Cited

U.S. PATENT DOCUMENTS

| 6,137,223 A * | 10/2000 | Hung et al. ............... 313/506 |
| 2004/0174116 A1 | 9/2004 | Lu et al. |
| 2004/0214041 A1* | 10/2004 | Lu et al. .................... 428/690 |
| 2004/0224183 A1 | 11/2004 | Nakamata .................. 428/690 |
| 2004/0245917 A1* | 12/2004 | Lu et al. .................... 313/503 |
| 2005/0007016 A1 | 1/2005 | Mori et al. |
| 2005/0035710 A1 | 2/2005 | Tanase et al. |
| 2005/0212003 A1* | 9/2005 | Murakami et al. .............. 257/98 |
| 2006/0049752 A1 | 3/2006 | Matsusue et al. |
| 2006/0076885 A1* | 4/2006 | Kim et al. .................... 313/506 |
| 2006/0202614 A1 | 9/2006 | Li |
| 2007/0159080 A1* | 7/2007 | Han et al. .................... 313/505 |
| 2007/0228942 A1* | 10/2007 | Akai et al. .................... 313/504 |
| 2008/0284325 A1* | 11/2008 | Noh et al. .................... 313/504 |

FOREIGN PATENT DOCUMENTS

| CN | 2443576 Y | 8/2001 |
| EP | 0 838 976 A1 | 4/1998 |
| JP | 06-093258 | 4/1994 |
| JP | 11-329734 | 11/1999 |
| JP | 2002-313582 | 10/2002 |
| JP | 2004-311419 | 11/2004 |
| JP | 2004-327436 | 11/2004 |
| JP | 2005-149981 | 6/2005 |
| JP | 2006-004781 | 1/2006 |
| JP | 2006-185659 A | 7/2006 |
| JP | 2006-278128 | 10/2006 |
| JP | 2006-332019 | 12/2006 |
| JP | 2007-095595 | 4/2007 |
| JP | 2007-123234 | 5/2007 |
| JP | 2007-154174 | 6/2007 |
| JP | 2007-157871 | 6/2007 |
| KR | 10-2005-0063534 | 6/2005 |
| KR | 10-2005-0079111 | 8/2005 |
| TW | 1232066 | 5/2005 |
| TW | 200714132 | 4/2007 |
| WO | WO 2004/049465 * | 6/2004 |
| WO | WO 2006/047149 A1 | 5/2006 |
| WO | WO 2008/029103 * | 3/2008 |

OTHER PUBLICATIONS

Patent Abstracts of Japan, Publication 11-329734, Published Nov. 30, 1999, for Sato, et al.
Japanese Office action dated May 11, 2010, for corresponding Japanese Patent application 2007-301907, noting listed references in this IDS.
Korean Patent Abstracts, Publication No. 1020050063534 A, dated Jun. 28, 2005, in the name of Tae Min Kang et al.
Korean Patent Abstracts, Publication No. 1020050079111 A, dated Aug. 9, 2005, in the name of Min Su Kang et al.
Japanese Office Action dated Oct. 5, 2010 for corresponding Japanese Patent Application No. 2007-301907, noting listed references in this IDS.
SIPO Office action dated Sep. 27, 2010, for corresponding Chinese Patent application 200810130647.0, noting listed reference in this IDS.
European Search Report dated Dec. 2, 2010, for corresponding European Patent application 08252271.5 noting listed references in this IDS.
Japanese Patent Office Action dated Sep. 6, 2011, for corresponding Japanese application No. 2007-301907, 3 pps.
Taiwanese Office action dated Nov. 29, 2011, for corresponding Taiwanese Patent application 097124500, 15 pages.

\* cited by examiner

*Primary Examiner* — Dawn Garrett
(74) *Attorney, Agent, or Firm* — Christie, Parker & Hale, LLP (57) ABSTRACT

An organic light emitting device is provided that includes: an anode including an anode material and for injecting holes; an organic layer including a light emitting layer on the anode; and a cathode on the organic layer and through which light emitted from the light emitting layer passes, wherein the cathode includes: a buffer layer, a metal oxide layer including a metal oxide, and a metal layer including a metal having an absolute work function value lower than an absolute work function value of the anode material and coupled to the buffer layer and the metal oxide layer.

47 Claims, 7 Drawing Sheets

ORGANIC LIGHT EMITTING DEVICE

CROSS-REFERENCE TO RELATED PATENT APPLICATION

This application claims priority to and the benefit of Korean Patent Application No. 10-2007-0066773, filed on Jul. 3, 2007, in the Korean Intellectual Property Office, the entire content of which is incorporated herein by reference.

BACKGROUND OF THE INVENTION

1. Field of the Invention

The present invention relates to an organic light emitting device, and more particularly, to an organic light emitting device including a cathode that has high light transmittance.

2. Description of the Related Art

Organic light emitting devices, which are self-emitting devices, have high brightness compared to liquid crystal display devices and can also be thinner than liquid crystal display devices because they do not use backlight units.

An organic light emitting device has a structure that includes an anode, an organic layer, and a cathode, which are sequentially stacked on a substrate on which pixel circuits are arranged and can be embodied as, for example, thin film transistors. Organic light emitting devices can be classified into two emission types according to the direction of light emission. These are a top emission type and a bottom emission type. In a top emission type organic light emitting device, light is emitted to form an image in a direction away from a substrate on which the organic light emitting device is disposed, that is, towards a cathode. Thus, the top emission type organic light emitting device can have a high aperture ratio compared to a bottom emission type organic light emitting device in which light is emitted to form an image in a direction towards the substrate, thereby having high light transmittance. Although the cathode, which is formed on the top of the organic light emitting device, needs to be transparent, the improvement of transparency of the cathode is limited. That is, while the cathode needs to have lower work function than the anode, a material having a low work function, such as a metal, generally has low light transmittance.

A conventional transparent cathode is formed of a thin film of a metal having a low work function. However, since the metal has a low light transmittance, improvement of light transmittance is limited.

As a result of the limitations on improving light transmittance of the top emission type light emitting structure, a micro-cavity which amplifies light emitted from a light emitting layer has been reported as a possible solution. However, since different colors have different ideal thicknesses of the micro-cavity, the thickness of the organic layers interposed between the anode and the cathode will vary. That is, since light is emitted by exitons formed by recombination of holes injected from the anode and electrons injected from the cathode in the organic light emitting layer, the thicknesses of the organic layers, particularly of a hole or electron injection layer, or a hole or electron transport layer, have been varied to control distances from exitons and resonance for each color. An independent mask is required for each color to vary the thicknesses of the deposited organic layers. However, such independent deposition has the disadvantages of further complicating processes and increasing costs for the manufacturing process.

Further, as the resolution of display devices increases, forming a more finely pitched mask pattern becomes increasingly difficult and independent deposition becomes increasingly difficult to apply to large area display devices.

Further, the thickness of the organic layers cannot be determined simply by optical efficiency since electrical characteristics of the device may worsen when the thickness of the hole layer or the electron layer varies.

SUMMARY OF THE INVENTION

An aspect of an embodiment of the present invention is directed toward a top emission type organic light emitting device having high light transmittance without the need for a resonance structure when light for forming an image is emitted in a direction toward a cathode.

An embodiment of the present invention provides an organic light emitting device including: an anode including an anode material and for injecting holes; an organic layer including a light emitting layer on the anode; and a cathode on the organic layer and through which light emitted from the light emitting layer passes, wherein the cathode includes: a buffer layer, a metal oxide layer including a metal oxide, and a metal layer including a metal having an absolute work function value lower than an absolute work function value of the anode material and coupled to the buffer layer and the metal oxide layer.

The metal oxide layer may include a material selected from the group consisting of an indium oxide, an indium tin oxide, a zinc oxide, an indium zinc oxide, $SnO_2$, AZO, $Ca_{12}Al_7O_x$, and combinations thereof.

The metal layer may include a metal having a work function in the range from about 1 to about 4.5 eV.

The metal layer may include a metal selected from the group consisting of Ag, Mg, Al, Pt, Pd, Au, Ni, Nd, Ir, Cr, Ca, In, and combinations thereof.

A thickness of the metal layer may be in the range from about 50 to about 150 Å.

The buffer layer may include an organic dipole material.

The buffer layer may include a material selected from the group consisting of fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO, YbO, and combinations thereof.

A thickness of the buffer layer may be less than about 20 Å.

The cathode may have at least about 85% light transmittance.

The cathode may have resistance in the range from about 0.001 to about 1000 $\Omega/\square$.

The cathode may have a work function in the range from about 1 to about 6 eV.

The organic light emitting device may further include an electron injection layer between the buffer layer and the metal layer.

The electron injection layer may include a material selected from the group consisting of $BaF_2$, LiF, NaF, $MgF_2$, $AlF_3$, $CaF_2$, NaCl, CsF, $Li_2O$, BaO, Liq, and combinations thereof.

A thickness of the electron injection layer may be less than about 10 Å.

The organic light emitting device may further include an intermediate layer between the metal layer and the metal oxide layer.

The intermediate layer may include a metal having a work function in the range from about 1 to about 5 eV or an alloy formed of at least two metals.

The intermediate layer may include a metal selected from the group consisting of In, Ag, Al, Ca, Mg, and combinations thereof.

A thickness of the intermediate layer may be in the range from about 1 to about 200 Å.

The anode may further include a reflective layer.

The reflective layer may include a material selected from the group consisting of Ag, Mg, Al, Pt, Pd, Au, Ni, Nd, Ir, Cr, and combinations thereof.

The anode material may include a material selected from the group consisting of an indium oxide, an indium tin oxide, a zinc oxide, an indium zinc oxide, and combinations thereof.

Another embodiment of the present invention provides an organic light emitting device including: an anode including an anode material and for injecting holes; an organic light emitting layer on the anode; a buffer layer on the organic light emitting layer; a metal layer including a metal having an absolute work function value lower than an absolute work function value of the anode material, the metal layer being on the buffer layer; and a metal oxide layer including a metal oxide on the metal layer.

The metal oxide layer may include a material selected from the group consisting of an indium oxide, indium tin oxide, zinc oxide, indium zinc oxide, $SnO_2$, AZO, $Ca_{12}Al_7O_x$, and combinations thereof.

The metal layer may include a metal having a work function in the range from about 1 to about 4.5 eV.

The metal layer may include a metal selected from the group consisting of Ag, Mg, Al, Pt, Pd, Au, Ni, Nd, Ir, Cr, Ca, In, and combinations thereof.

A thickness of the metal layer may be in the range from about 60 to about 150 Å.

The buffer layer may include an organic dipole material.

The buffer layer may include a material selected from the group consisting of fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO, YbO, and combinations thereof.

A thickness of the buffer layer may be less than about 20 Å.

The organic light emitting device may further include an electron injection layer between the buffer layer and the metal layer.

The electron injection layer includes a material selected from the group consisting of $BaF_2$, LiF, NaF, $MgF_2$, $AlF_3$, $CaF_2$, NaCl, CsF, $Li_2O$, BaO, Liq, and combinations thereof.

A thickness of the electron injection layer is less than about 10 Å.

The organic light emitting device may further include an intermediate layer between the metal layer and the metal oxide layer.

The intermediate layer may include a metal having a work function in the range from about 1 to about 5 eV or an alloy formed of at least two metals.

The intermediate layer may include a metal selected from the group consisting of In, Ag, Al, Ca, Mg, and combinations thereof.

A thickness of the intermediate layer may be in the range from about 1 to about 200 Å.

The anode may further include a reflective layer.

The reflective layer may include a material selected from the group consisting of Ag, Mg, Al, Pt, Pd, Au, Ni, Nd, Ir, Cr, and combinations thereof.

The anode material may include a material selected from the group consisting of an indium oxide, an indium tin oxide, a zinc oxide, an indium zinc oxide, and combinations thereof.

Another embodiment of the present invention provides an organic light emitting device including: an anode including an anode material and for injecting holes; an organic layer including a light emitting layer on the anode; and a cathode on the organic layer through which light emitted from the light emitting layer passes, wherein the cathode includes: a metal oxide layer including a metal oxide, and a complex layer coupled to the metal oxide layer and comprising a buffer material and a metal having an absolute work function value lower than an absolute work function value of the anode material.

The metal oxide layer may include a material selected from the group consisting of an indium oxide, an indium tin oxide, a zinc oxide, an indium zinc oxide, $SnO_2$, AZO, $Ca_{12}Al_7O_x$, and combinations thereof.

The metal may have a work function in the range from about 1 to about 4.5 eV.

The metal may be selected from the group consisting of Ag, Mg, Al, Pt, Pd, Au, Ni, Nd, Ir, Cr, Ca, In, and combinations thereof.

The buffer material may include an organic dipole material.

The buffer material may include a material selected from the group consisting of fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO, YbO, and combinations thereof.

A thickness of the complex layer may be in the range from about 60 to about 170 Å.

The organic light emitting device may further include an intermediate layer between the complex layer and the metal oxide layer.

The intermediate layer may include a metal having a work function in the range from about 1 to about 5 eV or an alloy formed of at least two metals.

The intermediate layer may include a metal selected from the group consisting of In, Ag, Al, Ca, Mg, and combinations thereof.

A thickness of the intermediate layer may be in the range from about 1 to about 200 Å.

The anode may further comprise a reflective layer.

The reflective layer may include a material selected from the group consisting of Ag, Mg, Al, Pt, Pd, Au, Ni, Nd, Ir, Cr, and combinations thereof.

The anode material may include a material selected from the group consisting of an indium oxide, indium tin oxide, zinc oxide, indium zinc oxide, and combinations thereof.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention have been shown and described, simply by way of illustration. As those skilled in the art would realized, the described embodiments may be modified in various different ways, all without departing from the spirit or scope of the present invention. Accordingly, the drawings and description are to be regarded as illustrative in nature and not restrictive. Like reference numerals designate like elements throughout the specification.

Figure 1:
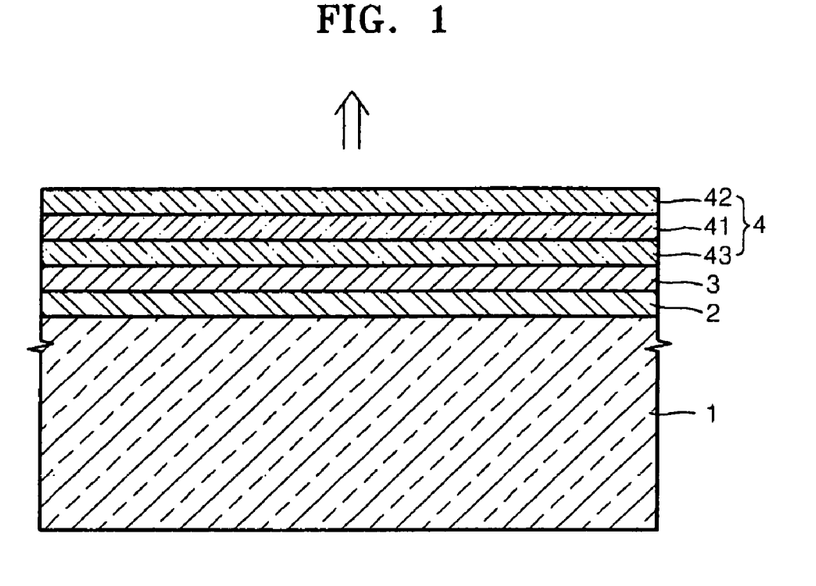
FIG. 1 shows a schematic cross-sectional view of an organic light emitting device according to an embodiment of the present invention.

FIG. 1 shows a schematic cross-sectional view of an organic light emitting device according to an embodiment of the present invention.

As shown in FIG. 1, the organic light emitting device according to an embodiment of the present invention includes an anode 2, an organic layer 3 and a cathode 4 sequentially stacked on a substrate 1.

In such an organic light emitting device, holes injected from the anode 2 and electrons injected from the cathode 4 combine to generate light in the organic layer 3. The light generated in the organic layer 3 is emitted towards the cathode 4, i.e., in the direction of the arrow shown on FIG. 1, and an image is formed in an upward direction from the cathode 4. This is referred to as a top emission type structure.

In such a top emission type structure, the cathode 4 includes a buffer layer 43, a metal layer 41, and a metal oxide layer 42, which are sequentially stacked on the organic layer 3.

The substrate 1 may be formed of a glass material, a plastic material, or a metal material. A pixel circuit, in which a thin film transistor and a capacitor may be combined, can be disposed on the substrate 1.

The anode 2 formed on the substrate 1 is connected to an external power source and provides holes to the organic layer 3. The anode 2 may include a material having a relatively high absolute work function value, such as an indium oxide (InO), an indium tin oxide (ITO), a zinc oxide (ZnO) and/or an indium zinc oxide (IZO).

The cathode 4 is connected to an external power source and provides electrons to the organic layer 3. The cathode 4 may include a metal layer 41 composed of a metal having a lower absolute work function value than the material forming the anode 2. For example, the work function of the metal forming the metal layer 41 may be in the range from about 1 to about 4.5 eV (or from 1 to 4.5 eV), and, in one embodiment, in the range from about 2 to about 4.2 eV (or from 2 to 4.2 eV), but is not limited thereto. The work function may be chosen based on the anode 2. More particularly, the metal layer 41 may include Ag, Mg, Al, Pt, Pd, Au, Ni, Nd, Ir, Cr, Ca and/or In, but is not limited thereto. The metal layer 41 functions as a layer for controlling (or lowering) the work function with respect to the anode 2.

As shown in FIG. 1, when light is emitted from the organic layer 3 towards the cathode 4, the light should easily pass through the cathode 4. For this to occur, the thickness of the metal layer 41 should be minimized. For example, the thickness of the metal layer 41 may be in the range from about 50 to about 150 Å (or from 50 to 150 Å), and, in one embodiment, in the range from about 60 to about 80 Å (or 60 to 80 Å), but is not limited thereto. The thickness of the metal layer 41 can be adjusted within the range described above in consideration of light transmittance and resistance characteristics of the cathode 4.

However, when the metal layer 41 is formed as a thin film over all of the pixels of the organic light emitting device, power loss is considerable because of sheet resistance or line resistance. To compensate for this problem, a metal oxide layer 42 is formed as an auxiliary electrode on the metal layer 41. The material forming the metal oxide layer 42 may have a relatively high work function to facilitate the injection of electrons (e.g., to the organic layer). For example, a material having a work function in the range from about 2 to about 4.5 eV (or from 2 to 4.5 eV), and, in one embodiment, in the range from about 2.5 to about 4.5 eV (or from 2.5 to 4.5 eV), may be used, but is not limited thereto.

The metal oxide layer 42 may include a material having a relatively high transmittance and conductivity, such as an indium oxide, an indium tin oxide, a zinc oxide, an indium zinc oxide, and/or $SnO_2$, AZO, $Ca_{12}Al_7O_x$.

The thickness of the metal oxide layer 42 may be in the range from about 100 to about 3000 Å (or from 100 to 3000 Å).

In addition, since the cathode 4, formed of the metal layer 41 and the metal oxide layer 42, has a low light transmittance as described in the background of the invention, optical resonance using micro-cavity structures has conventionally been used.

However, electron injection efficiency can be increased by interposing a buffer layer 43, including a buffer material, between the organic layer 3 and the metal layer 41. The buffer layer 43 may be a dipole material. Further, a buffer layer 43 of an organic dipole material attracts (or pulls) electrons. That is, when an electric field is applied to the cathode 4, particularly to the metal layer 41, the molecules of the buffer layer 43 have a positive polarity at one end and a negative polarity at the other end, and electrons can be injected. Thus, the combination of holes and electrons can be facilitated. As a result, light emitting efficiency can be increased without using a microcavity structure. Accordingly, light emitting efficiency can be improved while forming an image.

According to the present invention, a process for making the top emission type light emitting structure can be simplified by forming the buffer layer 43.

The buffer layer 43 may include a carbonaceous compound. Further, the buffer layer 43 may be fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO and/or YbO, but is not limited thereto.

The thickness of the buffer layer 43 may be less than about 20 Å (or 20 Å) and, in one embodiment, in the range from about 5 to about 20 Å (or from 5 to 20 Å). When the buffer layer 43 has a thickness within (or substantially within) this range, light transmittance and resistance characteristics of the cathode 4 can be improved.

The cathode 4 may have light transmittance of greater than about 85% (or 85%), and, in one embodiment, greater than about 90% (or 90%). Thus, the device, including the cathode 4, may have suitable light transmittance.

Further, the cathode has resistance in the range from about 0.001 to about 1000 Ω/☐ (or from 0.001 to 1000 Ω/☐), and, in one embodiment, in the range from about 0.001 to about 100 Ω/☐ (or from 0.001 to 1000 Ω/☐). Thus, the cathode 4 may have suitable conductivity. The cathode 4 may also have a work function in the range from about 1.0 to about 6.0 eV (or from 1.0 to 6.0 eV), and, in one embodiment, in the range from about 2.0 to about 5.0 eV (or from 2.0 to 5.0 eV). Thus, the cathode 4 may have suitable electron injecting capability. Therefore, an organic light emitting device including the cathode 4 may have suitable light emitting efficiency.

Figure 2:
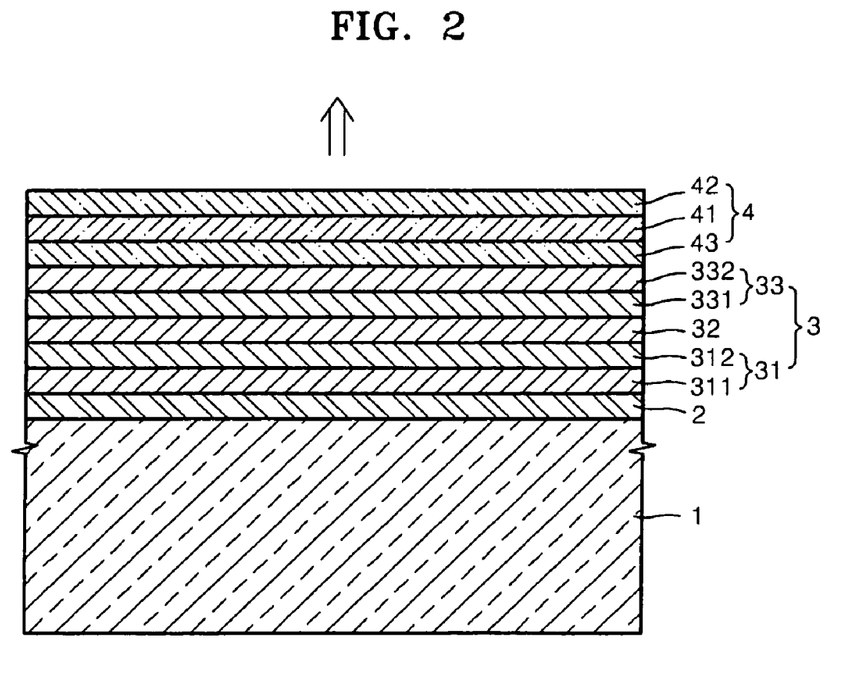
FIG. 2 shows a schematic cross-sectional view of an organic light emitting device according to another embodiment of the present invention.

FIG. 2 shows the organic layer 3 of the organic light emitting device of FIG. 1 in more detail.

The organic layer 3 includes a light emitting layer 32. A hole injection-transport layer 31 is interposed between the light emitting layer 32 and the anode 2, and an electron injection-transport layer 33 is interposed between the light emitting layer 32 and the cathode 4.

A material that is commonly used to form a light emitting layer can be used to form the light emitting layer 32. In addition, a known host and dopant can be used. For example, the light emitting layer 32 may include a host such as Alq₃, 4,4'-N,N'-dicarbazole-biphenyl (CBP), poly(n-vinylcarbazole (PVK), or distyrylarylene (DSA); and a blue dopant such as oxadiazole dimer dyes (Bis-DAPOXP), spiro compounds (Spiro-DPVBi, Spiro-6P), bis(styryl)amine (DPVBi, DSA), F₂Irpic, (F₂ppy)₂Ir(tmd), Ir(dfppz)₃, ter-fluorene or TNPe; or a green dopant such as Coumarin 6, C545T, Quinacridone, Ir(ppy)₃(ppy=phenylpyridine), Ir(ppy)₂(acac), or Ir(mpyp)₃; or a red dopant such as PtOEP, Ir(piq)₃, Btp₂Ir(acac), Eu(thenoyltrifluoroacetone)₃(Eu(TTA)₃, or butyl-6-(1,1,7,7,-tetramethyljulolidyl-9-enyl)-4H-pyran (DCJTB).

PtOEP

Ir(piq)₃

-continued

Btp₂Ir(acac)

Ir(ppy)₃

Ir(ppy)₂(acac)

Ir(mpyp)₃

F₂Irpic

(F₂ppy)₂Ir(tmd)

Ir(dfppz)₃

Firpic

TBPe

The amount of dopant may be in the range from about 0.1 to about 20 parts by weight (or from 0.1 to 20 parts by weight), and, in one embodiment, in the range from about 0.5 to about 12 parts by weight (or from 0.5 to 12 parts by weight) based on 100 parts by weight of the material forming the light emitting layer, that is, based on 100 parts by weight of the total weight of the host and the dopant. When the amount of the dopant is within (or substantially within) this range, concentration quenching can be substantially inhibited.

The light emitting layer 32 may also include a poly(phenylenevinylene) (PPV) based polymer or a derivative thereof, a polyphenylene (PPP) based polymer or a derivative thereof, a polythiophene (PT) based polymer or a derivative thereof, a polyfluorene (PF) based polymer or derivatives thereof and/or a polyspirofluorene (PSF) based polymer or derivatives thereof.

The hole injection-transport layer 31 may have a structure in which a hole injection layer (HIL) 311 and a hole transport layer (HTL) 312 are stacked on the anode 2. FIG. 2 shows a structure having both layers, but the hole injection-transport layer 31 may include at least one of the layers. Here, known hole injection materials and/or hole transport materials can be used.

A material forming the HIL 311 is not limited, and may be copper phthalocyanine (CuPc), a star-burst type amine derivative such as TCTA and m-MTDATA, a soluble and conductive polymer such as polyaniline/dodecylbenzenesulfonic acid (Pani/DBSA), poly(3,4-ethylenedioxythiophene)/poly(4-styrenesulfonate) (PEDOT/PSS), and polyaniline/camphor sulfonic acid (Pani/CSA) or (polyaniline)/poly(4-styrenesulfonate) (PANI/PSS).

TCTA m-MTDATA

The thickness of the HIL 311 may be in the range from about 100 to about 10,000 Å (or from 100 to 10,000 Å), and, in one embodiment, in the range from about 100 to about 1000 Å (or from 100 to 1000 Å). When the thickness of the HIL 311 is within (or substantially within) this range, suitable hole injection can be obtained, and an increase in driving voltage can be substantially inhibited.

The material forming the HTL 312 is not limited, and may include a compound having an arylamine group and/or a carbazole group transporting holes, a phthalocyanine compound and/or a triphenylene derivative. Further, the hole transport layer 312 may include 1,3,5-tricarbazolylbenzene, 4,4'-biscarbazolylbiphenyl, polyvinylcarbazol, m-biscarbazolylbenzene, 4,4'-biscarbazolyl-2,2'-dimethylbiphenyl, 4,4', 4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine(TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine(NPB), IDE320(Idemitsu Co.), (poly(9,9-dioctylfluorene-co-N-(4-butylphenyl)diphenylamine) (TFB), poly(9,9-dioctylfluorene-co-bis-(4-butylphenyl-bis-N,N-phenyl-1,4-phenylenediamin) (PFB) and/or poly(9,9-dioctylfluorene-co-bis-N,N-(4-butylphenyl)-bis-N,N-phenylbenzidine)(BFE), but the present invention is not limited thereto.

TPD

α-NPD

The thickness of the HTL 312 is in the range from about 50 to about 1000 Å (or from 50 to 1000 Å), and, in one embodiment, in the range from about 100 to about 600 Å (or from 100 to 600 Å). When the thickness of the HTL 312 is within this range, suitable hole transport properties can be obtained, and an increase in driving voltage can be substantially inhibited.

The hole injection-transport layer 31 may further include an electron blocking layer (EBL) to extend the lifetime of the organic light emitting device.

A hole blocking layer (HBL) may also be formed on the light emitting layer 32 to prevent (or block) triplet exitons or holes from being diffused to the electron transport layer 331 when the light emitting layer 32 includes a phosphorescent dopant. Here, the material forming the HBL is not limited, and may be a known HBL material. For example, the HBL may include an oxadiazole derivative, a triazole derivative, a phenanthroline derivative, or a hole blocking material disclosed in JP 11-329734(A1), Balq, BCP, or the like.

The thickness of the HBL is in the range from about 50 to about 1000 Å (or from 50 to 1000 Å), and, in one embodiment, in the range from about 100 to about 300 Å (or from 100 to 300 Å). When the thickness of the HBL is within (or substantially within) this range, relatively high hole transport properties can be obtained, and an increase in driving voltage can be substantially inhibited.

The electron injection-transport layer 33 may include an electron injection layer (EIL) 332 and an electron transport layer (ETL) 331. As shown in FIG. 2, the electron injection-transport layer 33 may have a structure in which both layers are stacked or a structure having one of the layers. Here, a material that is commonly used to form an electron injection-transport layer in organic light emitting devices can be used.

The thickness of the ETL 331 may be in the range from about 100 to about 1000 Å (or from 100 to 1000 Å), and, in one embodiment, in the range from about 100 to about 500 Å (or from 100 to 500 Å). When the thickness of the ETL 331 is within (or substantially within) this range, suitable hole transport properties can be obtained, and an increase in driving voltage can be substantially inhibited.

The ETL 331 is formed (e.g., on or over the light emitting layer 32) using vacuum deposition or spin coating. The material is not limited, and may include tris(8-hydroxyquinoline) aluminum ($Alq_3$), TAZ, and bis(10-hydroxybenzo[h]quinolinato)beryllium (Bebq2).

An electron injection layer 332 may be formed on the electron transport layer 331 using vacuum deposition or spin coating. The electron injection layer 332 may be $BaF_2$, LiF, NaF, $MgF_2$, $AlF_3$, $CaF_2$, NaCl, CsF, $Li_2O$, BaO, Liq, or the like, but is not limited thereto.

Figure 3:
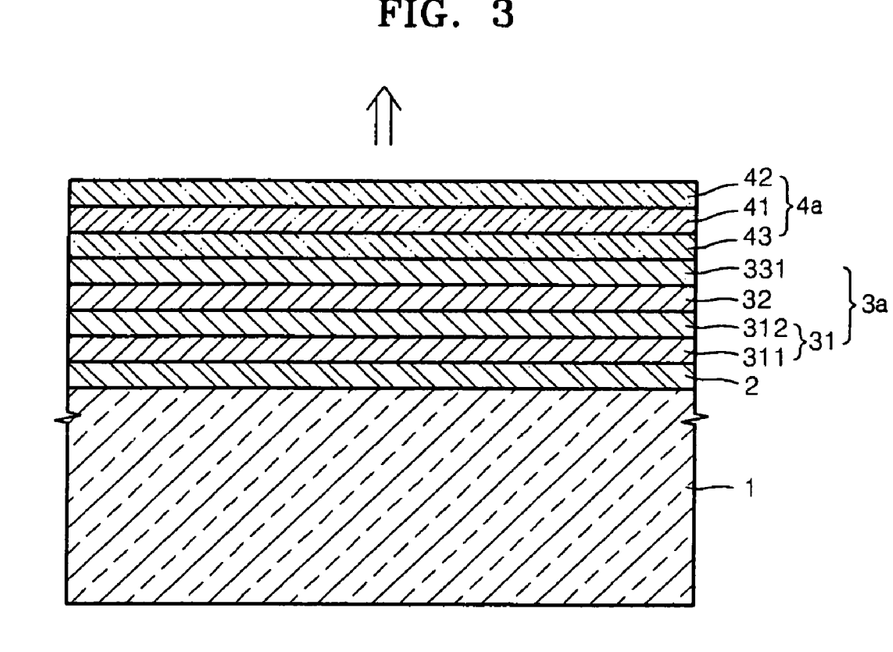
FIG. 3 shows a schematic cross-sectional view of an organic light emitting device according to another embodiment of the present invention.

FIG. 3 shows a schematic cross-sectional view of an organic light emitting device including a cathode 4a and an organic layer 3a according to another embodiment of the present invention. When the buffer layer 43 is included, the structure can be simplified since the same level of light emitting efficiency can be obtained when the electron injection-transport layer includes only the ETL 331 without the electron injection layer as shown in FIG. 3.

Figure 4:
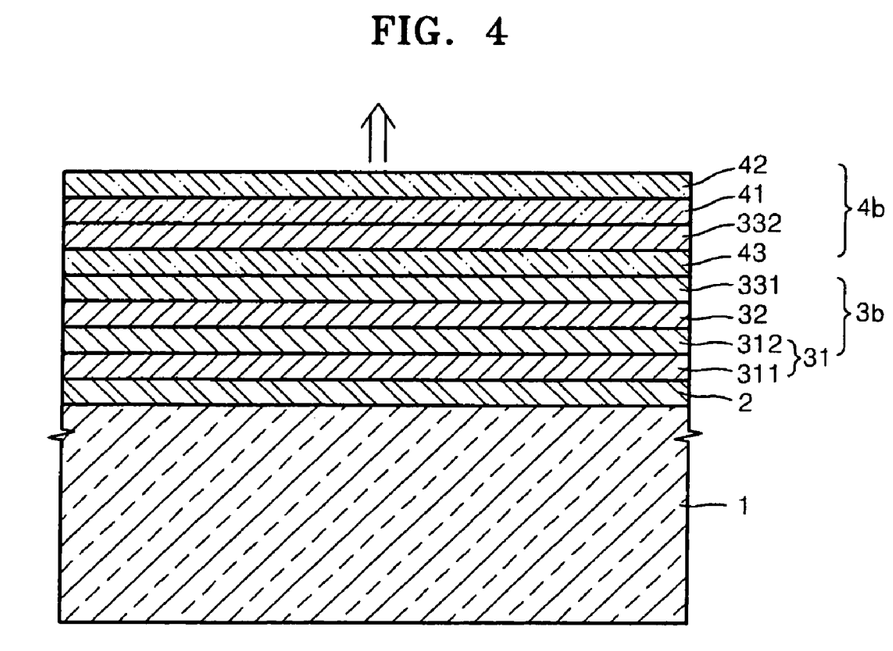
FIG. 4 shows a schematic cross-sectional view of an organic light emitting device according to another embodiment of the present invention.

FIG. 4 shows a schematic cross-sectional view of an organic light emitting device including a cathode 4b and an organic layer 3b according to another embodiment of the present invention.

As described above, the anode 2 is formed on the substrate 1, and the hole injection-transport layer 31 including the hole injection layer 311 and the hole transport layer 312 is formed on the anode 2. The light emitting layer 32 is formed on the hole injection-transport layer 31, and the electron transport layer 331 is formed on the light emitting layer 32.

The buffer layer 43 is formed on the electron transport layer 331, and the electron injection layer 332 is formed on the buffer layer 43. Then, the metal layer 41 and the metal oxide layer 42 are sequentially formed on the electron injection layer 332.

The thickness of the electron injection layer 332 is less than about 10 Å (or 10 Å), and, in one embodiment, in the range from about 3 to about 10 Å (or from 3 to 10 Å). When the thickness of the electron injection layer 332 is within (or substantially within) this range, light transmittance and resistance characteristics of the cathode 4b can be improved.

Here, the ratio of the work function of the anode 2 to that of the cathode 4b can be adjusted by the metal layer 41, and the metal oxide layer 42 compensates for the conductivity of the metal layer 41. Since the buffer layer 43 is interposed between the electron injection layer 332 and the electron transport layer 331, light emitting efficiency can be increased without using a micro-cavity structure.

An intermediate layer may also be interposed between the metal layer 41 and the metal oxide layer 42. The intermediate layer may improve ohmic contact between the metal layer 41 and the metal oxide layer 42.

The intermediate layer may include a material having a work function in the range from about 1.0 to about 5.0 eV (or from 1.0 to 5.0 eV), and, in one embodiment, in the range from about 2.0 to about 3.5 eV (or from 2.0 to 3.5 eV).

For example, the intermediate layer may include In, Ag, Al, Ca and/or Mg, but is not limited thereto.

The thickness of the intermediate layer may be in the range from about 1 to about 200 Å (or from 1 to 200 Å), and, in one embodiment, in the range from about 40 to about 100 Å (or from 40 to 100 Å). When the thickness of the intermediate layer is within (or substantially within) this range, light transmittance and resistance characteristics of the cathode 4 can be improved.

Figure 5:
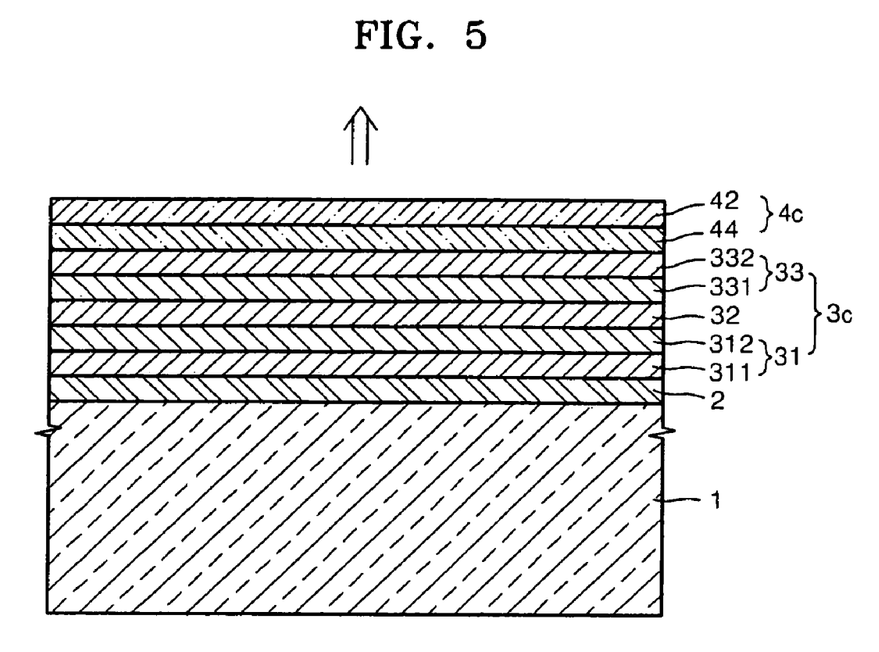
FIG. 5 shows a schematic cross-sectional view of an organic light emitting device according to another embodiment of the present invention.

FIG. 5 shows a schematic cross-sectional view of an organic light emitting device including a cathode 4c and an organic layer 3c according to another embodiment of the present invention.

As described above, the anode 2 is formed on the substrate 1, and the hole injection-transport layer 31, including the HIL 311 and the HTL 312, is formed on the anode 2. The light emitting layer 32 is formed on the hole injection-transport layer 31 and the electron injection-transport layer 33, including the ETL 331 and the EIL 332, is formed on the light emitting layer 32.

A complex layer 44, including a buffer material and a metal, is formed on the electron injection-transport layer 33. The complex layer 44 can be formed by co-depositing the buffer material and the metal. The buffer material is identical (or substantially identical) to the material used to form the buffer layer 43 described above, and the metal is identical (or substantially identical) to the material used to form the metal layer 41.

The thickness of the complex layer 44 may be in the range from about 60 to about 120 Å (or from 60 to 120 Å). When the thickness of the complex layer 44 is within (or substantially within) this range, light transmittance and resistance characteristics of a cathode 4c can be improved, thereby increasing light emitting efficiency.

Figure 6:
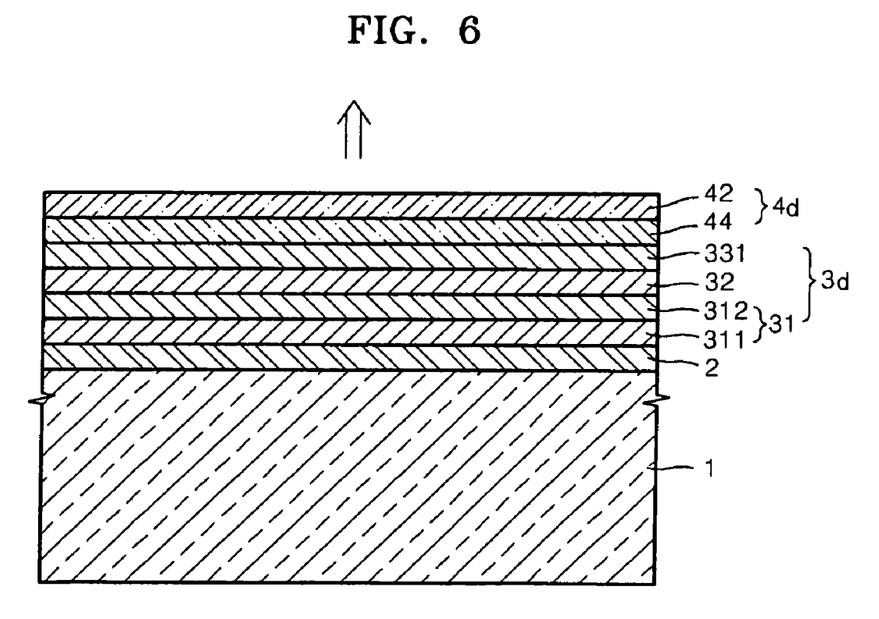
FIG. 6 shows a schematic cross-sectional view of an organic light emitting device according to another embodiment of the present invention.

FIG. 6 shows a schematic cross-sectional view of an organic light emitting device including a cathode 4d and an organic layer 3d according to another embodiment of the present invention. When the complex layer 44 is included, the EIL 332 may not be included, as shown in FIG. 6.

In addition, an intermediate layer may further be interposed between the metal oxide layer 42 and the complex layer 44. The intermediate layer may improve ohmic contact between the metal oxide layer 42 and the complex layer 44.

The intermediate layer may include a material having a work function in the range from about 1.0 to about 5.0 eV (or from 1.0 to 5.0 eV), and, in one embodiment, in the range from about 2.0 to about 3.5 eV (or from 2.0 to 3.5 eV).

For example, the intermediate layer may include In, Ag, Al, Ca and/or Mg, but is not limited thereto.

The thickness of the intermediate layer may be in the range from about 1 to about 200 Å (or from 1 to 200 Å), and, in one embodiment, in the range from about 40 to about 100 Å (or from 40 to 100 Å). When the thickness of the intermediate layer is within this range, light transmittance and resistance characteristics of the cathode 4 can be improved.

Figure 7:
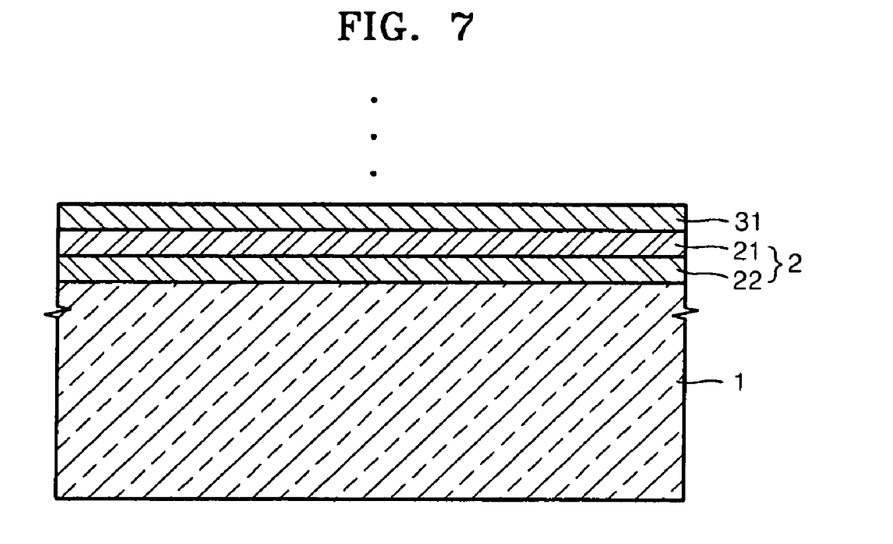
FIG. 7 shows a cross-sectional view of an anode of an organic light emitting device according to an embodiment of the present invention.

In addition, the anode 2 may include a reflective layer 22 on the substrate 1 and an anode material layer 21 on the reflective layer 22 which injects holes into the hole injection-transport layer 31, as shown in FIG. 7.

The anode material layer 21 may include a material having a sufficiently high work function selected from indium oxide (InO), an indium tin oxide (ITO), a zinc oxide (ZnO), and an indium zinc oxide (IZO).

The reflective layer 22 may include a material having high light reflectivity selected from Ag, Mg, Al, Pt, Pd, Au, Ni, Nd, Ir, Cr and compounds thereof.

Figure 8:
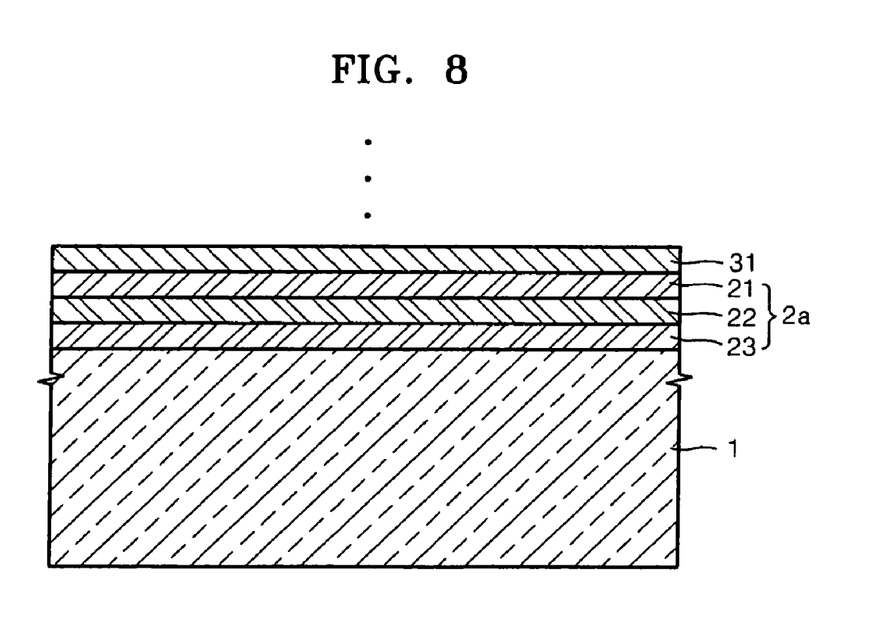
FIG. 8 shows a cross-sectional view of an anode of an organic light emitting device according to another embodiment of the present invention.

FIG. 8 shows a schematic cross-sectional view of an organic light emitting device including an anode 2a according to another embodiment of the present invention. The anode 2 may have a sandwich structure as shown in FIG. 8 with a layer 23 formed of the same (or substantially the same) material as the anode material layer 21 being disposed under the reflective layer 22.

Figure 9:
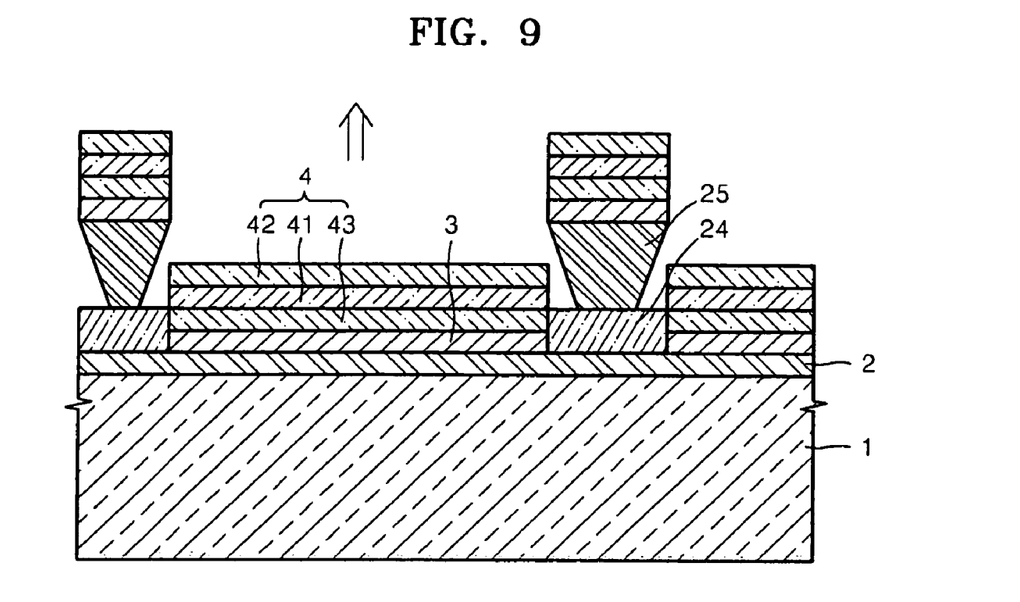
FIG. 9 shows a cross-sectional view of a passive matrix type organic light emitting display device to which an organic light emitting device of FIG. 1 is applied.
Figure 10:
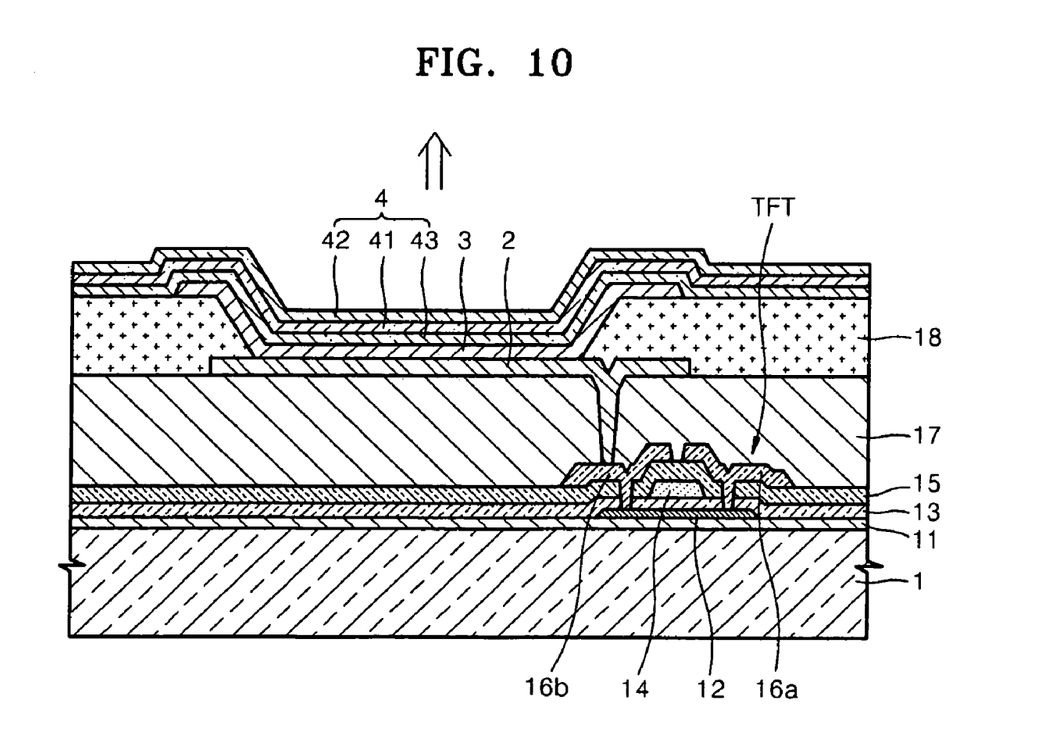
FIG. 10 shows a cross-sectional view of an active matrix type organic light emitting display device to which an organic light emitting device of FIG. 1 is applied.

The structure can be utilized in a passive matrix type (PM) top emission organic light emitting display device, shown in FIG. 9, or an active matrix type (AM) top emission organic light emitting display device, shown in FIG. 10. The embodiments shown in FIGS. 9 and 10 are applications of FIG. 1. The embodiments of FIGS. 2 through 8 may also be applied to the embodiments of FIGS. 9 and 10.

Referring to FIG. 9, in a passive matrix type organic light emitting display device, the anode 2 is formed in a stripe pattern on the substrate 1, and an inner insulating layer 24 is formed on the anode 2. A separator 25 crosses the anode 2 at right angles on the inner insulating layer 24 to pattern the organic layer 3 and the cathode 4. The organic layer 3 and the cathode 4 are patterned by the separator 25 to cross the anode 2. A sealing member (not shown) is formed on the anode 2 to isolate the organic light emitting device from the air. The organic layer 3 and the cathode 4 can be formed through a patterned mask without using the separator 25.

Light extraction efficiency can be increased without using a micro-cavity structure in a PM organic light emitting display device, and, accordingly, an appropriate level of light emitting efficiency can be obtained.

Referring to FIG. 10, in an active matrix type organic light emitting display device, a pixel circuit including a thin film transistor (TFT) is on the substrate 1. The pixel circuit includes at least one TFT and the TFT is electrically connected to the organic light emitting device.

The buffer layer 11 is on the substrate 1, and a semiconductor active layer 12 having a pattern (that may be predetermined) is on the buffer layer 11. A gate insulating layer 13 formed of $SiO_2$, SiNx, or the like is on the active layer 12, and a gate electrode 14 is on a part of the gate insulating layer 13. The gate electrode 14 is connected to a gate line, which applies on/off signals to a TFT. An interlayer dielectric layer 15 is on the gate electrode 14, and a source electrode 16a and a drain electrode 16b contact a source region and a drain region of the active layer 12, respectively.

The TFT is covered with a planarization layer 17 for its protection, and the upper surface of the planarization layer 17 may be flat such that the anode 2 is easily formed on the planarization layer 17.

The anode 2 is on the planarization layer 17, and a pixel defining layer 18 is an insulating material covering the planarization layer 17. The pixel defining layer 18 may have an opening through which the anode 2 is exposed. The organic layer 3 is deposited on the exposed anode 2, and the cathode 4 is deposited over the anode 2 and the organic layer 3.

In such an AM organic light emitting display device, light extraction efficiency can be increased without using a microcavity structure, and, accordingly, a suitable level of light emitting efficiency can be obtained.

The present invention will be described in more detail with reference to the following examples. However, the present invention is not limited by these examples.

EXAMPLES

Preparation Example 1

An electron only device having the following structure was prepared by forming a reference electrode (MgAg layer (18 nm)/LiF electron injection layer (0.5 nm))/Bebq2 electron transport layer (60 nm)/LiF electron injection layer (0.5 nm)/MgAg layer (18 nm).

The electron only device is a device in which only electrons flow, and is formed by disposing each layer of the device having a structure described above on a glass substrate in sequence using vacuum deposition. The MgAg layer is formed by co-depositing Mg and Ag in a ratio of 10:1.

Preparation Example 2

An electron only device having the following structure was prepared by forming a first electrode (InO metal oxide layer (100 nm)/Mg metal layer (5 nm)/LiF electron injection layer (0.5 nm))/Bebq2 electron transport layer (30 nm)/reference electrode (LiF electron injection layer (0.5 nm)/MgAg layer (18nm)).

The electron only device is a device in which only electrons flow, and is formed by disposing each layer of the device having a structure described above on a glass substrate in sequence using vacuum deposition. The MgAg layer is formed by co-depositing Mg and Ag in a ratio of 10:1.

Preparation Example 3

An electron only device having the following structure was prepared by forming a second electrode (InO metal oxide layer (100 nm)/LiF electron injection layer (0.5 nm)/$C_{60}$ buffer layer (3 nm))/Bebq2 electron transport layer (30 nm)/reference electrode (LiF electron injection layer (0.5 nm)/MgAg layer (18 nm)).

The electron only device is a device in which only electrons flow, and is formed by disposing each layer of the device having a structure described above on a glass substrate in sequence using vacuum deposition. The MgAg layer is formed by co-depositing Mg and Ag in a ratio of 10:1.

Preparation Example 4

An electron only device having the following structure was prepared by forming a third electrode (InO metal oxide layer (100 nm)/Mg metal layer (5 nm)/LiF electron injection layer (0.5 nm))/$C_{60}$ buffer layer (3 nm)/Bebq2 electron transport layer (30 nm)/reference electrode (LiF electron injection layer (0.5 nm)/MgAg layer (18 nm)).

The electron only device is a device in which only electrons flow, and is formed by disposing each layer of the device having a structure described above on a glass substrate in sequence using vacuum deposition. The MgAg layer is formed by co-depositing Mg and Ag in a ratio of 10:1.

Evaluation Example 1

Figure 11:
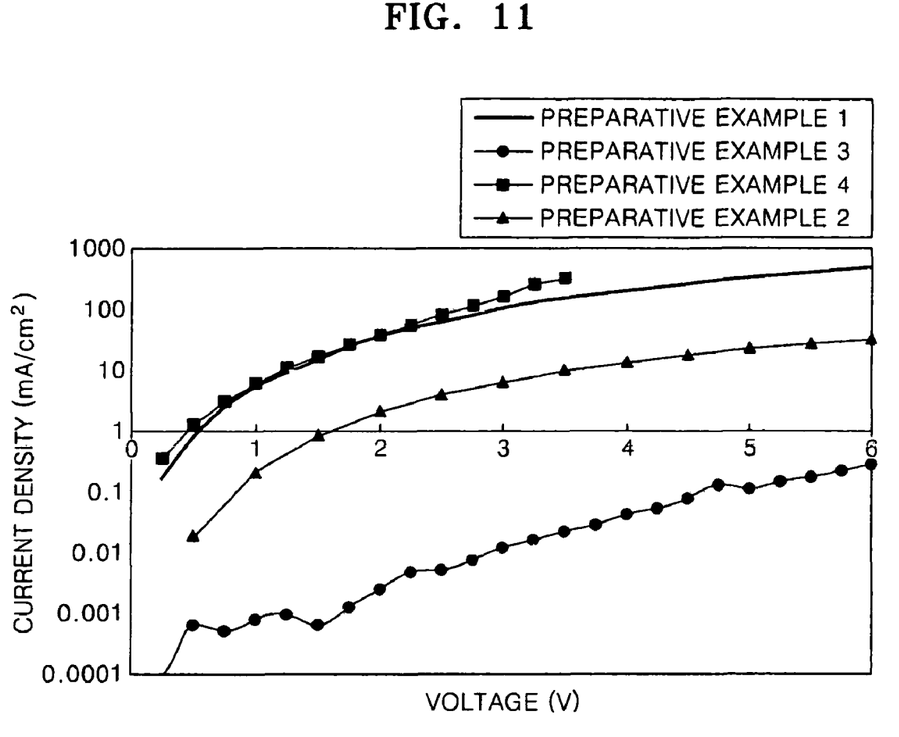
FIG. 11 shows a graph illustrating current density characteristics of organic light emitting devices prepared according to Preparation Examples 1 to 4.

Current-voltage characteristics of the organic light emitting devices prepared according to Preparation Examples 1 through 4 were evaluated using a Keithley 238 source-measure unit, and the results are shown in FIG. 11. According to FIG. 11, the organic light emitting device, including the third electrode of the present invention having a structure of InO metal oxide layer (100 nm)/Mg metal layer (5 nm)/LiF electron injection layer (0.5 nm))/$C_{60}$ buffer layer (3 nm) prepared according to Preparation Example 4, had the highest current density characteristics. Therefore, the third electrode has suitable electron injection characteristics.

Comparative Example 1

An organic light emitting device having the following structure was prepared by forming ITO anode/CuPc hole injection layer (60 nm)/NPD hole transport layer (30 nm)/DSA+3 wt % TBPe blue light emitting layer (25 nm)/Balq hole blocking layer (5 nm)/Bebq electron transport layer (20 nm)/cathode (LiF electron injection layer (1 nm)/MgAg layer (100 nm)).

First, a 15 Ω/cm² (1000 Å) ITO glass substrate was cut into pieces 50 mm×50 mm×0.7 mm in size, and then the pieces were ultrasonically cleaned for 15 minutes each in isopropyl alcohol and deionized water, and then the pieces were UV ozone cleaned for 30 minutes to prepare a substrate including an ITO anode.

Then, CuPc, as a hole injection material, was deposited to a thickness of 60 nm on the ITO anode to form a hole injection layer. NPD, as a hole transport material, was deposited to a thickness of 30 nm on the hole injection layer to form a hole transport layer.

DSA (Samsung SDI Co., Ltd.) and TBPe (Samsung SDI Co., Ltd.), in which 3 parts by weight of TBPe per 100 parts by weight of DSA were used, were deposited to a thickness of 25 nm on the hole transport layer to form a blue light emitting layer, and Balq was deposited to a thickness of 5 nm on the blue light emitting layer to form a hole blocking layer. Then, Alq3 was deposited to a thickness of 20 nm on the hole blocking layer to form an electron transport layer, and LiF was deposited to a thickness of 1 nm on the hole transport layer to form an electron injection layer. Mg and Ag were co-deposited in the ratio of 10:1 to a thickness of 100 nm to form the MgAg layer to prepare a cathode.

Example 1

An organic light emitting device having the following structure was prepared in the same (or substantially the same) manner as in Comparative Example 1, except that an electrode having a structure of $C_{60}$ buffer layer (3 nm)/LiF electron injection layer (1 nm)/Mg metal layer (5 nm)/InO metal oxide layer (100 nm) was formed as the cathode instead of the electrode having a structure of LiF electron injection layer (1 nm)/MgAg layer (100 nm): ITO anode/CuPc hole injection layer (60 nm)/NPD hole transport layer (30 nm)/DSA+3 wt % TBPe blue light emitting layer (25 nm)/Balq hole blocking layer (5 nm)/Bebq2 electron transport layer (20 nm)/cathode ($C_{60}$ buffer layer (3 nm)/LiF electron injection layer (1 nm)/Mg metal layer (5 nm)/InO metal oxide layer (100 nm)).

Evaluation Example 2

Figure 12:
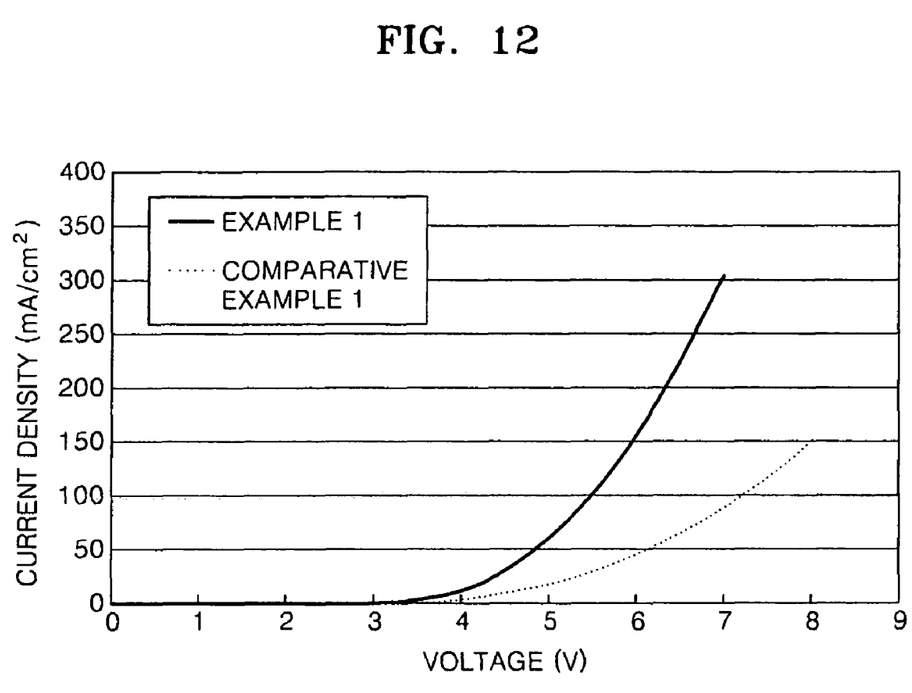
FIG. 12 shows a graph illustrating current density characteristics of organic light emitting devices prepared according to Comparative Example 1 and Example 1.

Current-voltage characteristics of the organic light emitting devices prepared according to Comparative Example 1 and Example 1 were evaluated using a Keithley 238 source-measure unit, and the results are shown in FIG. 12. According to FIG. 12, the organic light emitting device of Example 1 of the present invention has more suitable current density and efficiency characteristics compared to the organic light emitting device of Comparative Example 1.

In addition, current efficiency of the organic light emitting device of Example 1 was about 6.5 cd/A, and thus the organic light emitting device has excellent electrical characteristics.

In view of the foregoing, in the light emitting device according to an embodiment of the present invention as described above, light extraction efficiency can be increased without using a micro-cavity structure in a top emission type light emitting structure, and driving voltage can be reduced.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting device comprising:
   an anode comprising an anode material and for injecting holes;
   an organic layer comprising a light emitting layer on the anode; and
   a cathode on the organic layer and through which light emitted from the light emitting layer passes,
   wherein the cathode comprises:
   a buffer layer comprising a material selected from the group consisting of fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO, YbO, and combinations thereof,
   a metal oxide layer comprising a metal oxide, and
   a metal layer comprising a metal having an absolute work function value lower than an absolute work function value of the anode material and coupled to the buffer layer and the metal oxide layer.

2. The organic light emitting device of claim 1, wherein the metal oxide layer comprises a material selected from the group consisting of an indium oxide, an indium tin oxide, a zinc oxide, an indium zinc oxide, $SnO_2$, aluminum-doped zinc oxide (AZO), $Ca_{12}Al_7O_x$, where x is a number greater than 0, and combinations thereof.

3. The organic light emitting device of claim 1, wherein the metal layer comprises a metal having a work function in the range from about 1 to about 4.5 eV.

4. The organic light emitting device of claim 1, wherein the metal layer comprises a metal selected from the group consisting of Ag, Mg, Al, Pt, Pd, Au, Ni, Nd, Ir, Cr, Ca, In, and combinations thereof.

5. The organic light emitting device of claim 1, wherein a thickness of the metal layer is in the range from about 50 to about 150 Å.

6. The organic light emitting device of claim 1, wherein a thickness of the buffer layer is greater than zero and less than about 20 Å.

7. The organic light emitting device of claim 1, wherein the cathode has at least about 85% light transmittance.

8. The organic light emitting device of claim 1, wherein the cathode has resistance in the range from about 0.001 to about 1000 Ω/□.

9. The organic light emitting device of claim 1, wherein the cathode has a work function in the range from about 1 to about 6 eV.

10. An organic light emitting device comprising:
    an anode comprising an anode material and for injecting holes;
    an organic layer comprising a light emitting layer on the anode;
    a cathode on the organic layer and through which light emitted from the light emitting layer passes,
    wherein the cathode comprises:
    a buffer layer,
    a metal oxide layer comprising a metal oxide, and
    a metal layer comprising a metal having an absolute work function value lower than an absolute work function value of the anode material and coupled to the buffer layer and the metal oxide layer; and
    an electron injection layer between the buffer layer and the metal layer.

11. The organic light emitting device of claim 10, wherein the electron injection layer comprises a material selected from the group consisting of $BaF_2$, LiF, NaF, $MgF_2$, $AlF_3$, $CaF_2$, NaCl, CsF, $Li_2O$, BaO, Liq, and combinations thereof.

12. The organic light emitting device of claim 10, wherein a thickness of the electron injection layer is greater than zero and less than about 10 Å.

13. An organic light emitting device comprising:
    an anode comprising an anode material and for injecting holes;
    an organic layer comprising a light emitting layer on the anode;
    a cathode on the organic layer and through which light emitted from the light emitting layer passes,
    wherein the cathode comprises:
    a buffer layer,
    a metal oxide layer comprising a metal oxide, and
    a metal layer comprising a metal having an absolute work function value lower than an absolute work function value of the anode material and coupled to the buffer layer and the metal oxide layer; and
    an intermediate layer between the metal layer and the metal oxide layer.

14. The organic light emitting device of claim 13, wherein the intermediate layer comprises a metal having a work function in the range from about 1 to about 5 eV or an alloy formed of at least two metals.

15. The organic light emitting device of claim 13, wherein the intermediate layer comprises a metal selected from the group consisting of In, Ag, Al, Ca, Mg, and combinations thereof.

16. The organic light emitting device of claim 13, wherein a thickness of the intermediate layer is in the range from about 1 to about 200 Å.

17. The organic light emitting device of claim 1, wherein the anode further comprises a reflective layer.

18. The organic light emitting device of claim 17, wherein the reflective layer comprises a material selected from the group consisting of Ag, Mg, Al, Pt, Pd, Au, Ni, Nd, Ir, Cr, and combinations thereof.

19. The organic light emitting device of claim 1, wherein the anode material comprises a material selected from the group consisting of an indium oxide, an indium tin oxide, a zinc oxide, an indium zinc oxide, and combinations thereof.

20. An organic light emitting device comprising:
    an anode comprising an anode material and for injecting holes;
    an organic light emitting layer on the anode;
    a buffer layer on the organic light emitting layer comprising a material selected from the group consisting of fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO, YbO, and combinations thereof;

a metal layer comprising a metal having an absolute work function value lower than an absolute work function value of the anode material, the metal layer being on the buffer layer; and a metal oxide layer comprising a metal oxide on the metal layer.

21. The organic light emitting device of claim 20, wherein the metal oxide layer comprises a material selected from the group consisting of an indium oxide, indium tin oxide, zinc oxide, indium zinc oxide, $SnO_2$, aluminum-doped zinc oxide (AZO), $Ca_{12}Al_7O_x$, where x is a number greater than 0, and combinations thereof.

22. The organic light emitting device of claim 20, wherein the metal layer comprises a metal having a work function in the range from about 1 to about 4.5 eV.

23. The organic light emitting device of claim 20, wherein the metal layer comprises a metal selected from the group consisting of Ag, Mg, Al, Pt, Pd, Au, Ni, Nd, Ir, Cr, Ca, In, and combinations thereof.

24. The organic light emitting device of claim 20, wherein a thickness of the metal layer is in the range from about 60 to about 150 Å.

25. The organic light emitting device of claim 20, wherein a thickness of the buffer layer is greater than zero and less than about 20 Å.

26. An organic light emitting device comprising:
an anode comprising an anode material and for injecting holes;
an organic light emitting layer on the anode;
a buffer layer on the organic light emitting layer;
a metal layer comprising a metal having an absolute work function value lower than an absolute work function value of the anode material, the metal layer being on the buffer layer;
a metal oxide layer comprising a metal oxide on the metal layer; and
an electron injection layer between the buffer layer and the metal layer.

27. The organic light emitting device of claim 26 wherein the electron injection layer comprises a material selected from the group consisting of $BaF_2$, LiF, NaF, $MgF_2$, $AlF_3$, $CaF_2$, NaCl, CsF, $Li_2O$, BaO, Liq, and combinations thereof.

28. The organic light emitting device of claim 26, wherein a thickness of the electron injection layer is greater than zero and less than about 10 Å.

29. An organic light emitting device comprising:
an anode comprising an anode material and for injecting holes;
an organic light emitting layer on the anode;
a buffer layer on the organic light emitting layer;
a metal layer comprising a metal having an absolute work function value lower than an absolute work function value of the anode material, the metal layer being on the buffer layer;
a metal oxide layer comprising a metal oxide on the metal layer; and
an intermediate layer between the metal layer and the metal oxide layer.

30. The organic light emitting device of claim 29, wherein the intermediate layer comprises a metal having a work function in the range from about 1 to about 5 eV or an alloy formed of at least two metals.

31. The organic light emitting device of claim 29, wherein the intermediate layer comprises a metal selected from the group consisting of In, Ag, Al, Ca, Mg, and combinations thereof.

32. The organic light emitting device of claim 29, wherein a thickness of the intermediate layer is in the range from about 1 to about 200 Å.

33. The organic light emitting device of claim 20, wherein the anode further comprises a reflective layer.

34. The organic light emitting device of claim 33, wherein the reflective layer comprises a material selected from the group consisting of Ag, Mg, Al, Pt, Pd, Au, Ni, Nd, Ir, Cr, and combinations thereof.

35. The organic light emitting device of claim 20, wherein the anode material comprises a material selected from the group consisting of an indium oxide, an indium tin oxide, a zinc oxide, an indium zinc oxide, and combinations thereof.

36. An organic light emitting device comprising:
an anode comprising an anode material and for injecting holes;
an organic layer comprising a light emitting layer on the anode; and
a cathode on the organic layer through which light emitted from the light emitting layer passes,
wherein the cathode comprises:
a metal oxide layer comprising a metal oxide, and a complex layer coupled to the metal oxide layer and comprising a buffer material and a metal having an absolute work function value lower than an absolute work function value of the anode material, wherein the buffer material comprises a material selected from the group consisting of fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO, YbO, and combinations thereof.

37. The organic light emitting device of claim 36, wherein the metal oxide layer comprises a material selected from the group consisting of an indium oxide, an indium tin oxide, a zinc oxide, an indium zinc oxide, $SnO_2$, aluminum-doped zinc oxide (AZO), $Ca_{12}Al_7O_x$, where x is a number greater than 0, and combinations thereof.

38. The organic light emitting device of claim 36, wherein the metal has a work function in the range from about 1 to about 4.5 eV.

39. The organic light emitting device of claim 36, wherein the metal is selected from the group consisting of Ag, Mg, Al, Pt, Pd, Au, Ni, Nd, Ir, Cr, Ca, In, and combinations thereof.

40. An organic light emitting device comprising:
an anode comprising an anode material and for injecting holes;
an organic layer comprising a light emitting layer on the anode; and
a cathode on the organic layer through which light emitted from the light emitting layer passes,
wherein the cathode comprises:
a metal oxide layer comprising a metal oxide, and
a complex layer coupled to the metal oxide layer and comprising a buffer material and a metal having an absolute work function value lower than an absolute work function value of the anode material, wherein the buffer material comprises a material selected from the group consisting of fullerene, a metal-containing fullerene-based complex, carbon nanotube, carbon fiber, carbon black, graphite, carbyne, $MgC_{60}$, $SrC_{60}$, $CaC_{60}$, $C_{60}$, $C_{70}$, MgO, YbO, and combinations thereof,
wherein a thickness of the complex layer is in the range from about 60 to about 170Å.

41. An organic light emitting device comprising:
an anode comprising an anode material and for injecting holes;

an organic layer comprising a light emitting layer on the anode;

a cathode on the organic layer through which light emitted from the light emitting layer passes, wherein the cathode comprises:

a metal oxide layer comprising a metal oxide, and a complex layer coupled to the metal oxide layer and comprising a buffer material and a metal having an absolute work function value lower than an absolute work function value of the anode material; and an intermediate layer between the complex layer and the metal oxide layer.

42. The organic light emitting device of claim 41, wherein the intermediate layer comprises a metal having a work function in the range from about 1 to about 5 eV or an alloy formed of at least two metals.

43. The organic light emitting device of claim 41, wherein the intermediate layer comprises a metal selected from the group consisting of In, Ag, Al, Ca, Mg, and combinations thereof.

44. The organic light emitting device of claim 41, wherein a thickness of the intermediate layer is in the range from about 1 to about 200 ÅA.

45. The organic light emitting device of claim 36, wherein the anode further comprises a reflective layer.

46. The organic light emitting device of claim 45, wherein the reflective layer comprises a material selected from the group consisting of Ag, Mg, Al, Pt, Pd, Au, Ni, Nd, Ir, Cr, and combinations thereof.

47. The organic light emitting device of claim 46, wherein the anode material comprises a material selected from the group consisting of an indium oxide, indium tin oxide, zinc oxide, indium zinc oxide, and combinations thereof.

* * * * *

UNITED STATES PATENT AND TRADEMARK OFFICE
CERTIFICATE OF CORRECTION

PATENT NO. : 8,119,256 B2
APPLICATION NO. : 12/056141
DATED : February 21, 2012
INVENTOR(S) : Jin-Baek Choi et al.

It is certified that error appears in the above-identified patent and that said Letters Patent is hereby corrected as shown below:

In the Claims

Column 22, Claim 47, line 14      Delete "46"
                                  Insert -- 36 --

Signed and Sealed this
Twenty-seventh Day of August, 2013

Teresa Stanek Rea
*Acting Director of the United States Patent and Trademark Office*